United States Patent
Namioka

(10) Patent No.: US 9,412,256 B2
(45) Date of Patent: Aug. 9, 2016

(54) SYSTEM FOR MONITORING FAILURE OF SUBSTRATE PROCESSING APPARATUS, AND METHOD FOR MONITORING FAILURE OF SUBSTRATE PROCESSING APPARATUS

(71) Applicant: TOKYO ELECTRON LIMITED, Tokyo (JP)

(72) Inventor: Ichiro Namioka, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/387,668

(22) PCT Filed: Mar. 14, 2013

(86) PCT No.: PCT/JP2013/001691
§ 371 (c)(1),
(2) Date: Sep. 24, 2014

(87) PCT Pub. No.: WO2013/145606
PCT Pub. Date: Oct. 3, 2013

(65) Prior Publication Data
US 2015/0084772 A1    Mar. 26, 2015

(30) Foreign Application Priority Data
Mar. 26, 2012   (JP) .................. 2012-069430

(51) Int. Cl.
*G08B 21/00* (2006.01)
*G08B 21/18* (2006.01)
*H01L 21/67* (2006.01)

(52) U.S. Cl.
CPC .......... *G08B 21/18* (2013.01); *H01L 21/67288* (2013.01)

(58) Field of Classification Search
CPC .................. G08B 13/19682; G08B 13/1968; G08B 13/19656; G08B 13/19615; G08B 13/19619; G08B 13/19621; G08B 13/1966; G08B 13/19663; G08B 13/19673; G08B 13/19602; G08B 13/19604; G08B 13/19608; G08B 13/196
USPC ............. 340/540, 568.1, 572.1–572.9, 539.1, 340/603, 627, 506, 501, 517, 521, 522, 531
See application file for complete search history.

(56) References Cited

U.S. PATENT DOCUMENTS

| | | | |
|---|---|---|---|
| 2007/0035908 A1* | 2/2007 | Kitsunai | H01L 21/6833 361/234 |
| 2007/0238201 A1* | 10/2007 | Funk | H01L 22/12 438/14 |
| 2011/0012735 A1* | 1/2011 | Kestenbaum | G06K 17/00 340/658.1 |

(Continued)

FOREIGN PATENT DOCUMENTS

| | | |
|---|---|---|
| JP | 2012-19156 A | 1/2012 |
| TW | 201142554 A | 12/2011 |

OTHER PUBLICATIONS

International Search Report mailed Apr. 23, 2013 in PCT/JP2013/001691.

*Primary Examiner* — Daniel Previl
(74) *Attorney, Agent, or Firm* — Rothwell, Figg, Ernst & Manbeck, P.C.

(57) ABSTRACT

Disclosed is a failure monitoring system for monitoring a failure of a substrate processing apparatus that performs a predetermined processing on a substrate to be processed, the failure monitoring system including: an alarm collecting unit configured to collects alarms issued from the substrate processing apparatus; and an analyzing unit configured to analyze the alarms collected by the alarm collecting unit and display, as an image, an alarm issuing frequency in each monitoring period on a two-dimensional space, of which one axis represents an alarm ID that specifies an alarm issuing area and another axis represents a predetermined monitor period.

7 Claims, 7 Drawing Sheets

(56) References Cited

U.S. PATENT DOCUMENTS

| | | | | |
|---|---|---|---|---|
| 2011/0060946 A1* | 3/2011 | Gupta | ................ | G06F 11/0709 714/26 |
| 2011/0316376 A1* | 12/2011 | Sortore | ............... | F16C 32/0459 310/90.5 |
| 2014/0122709 A1* | 5/2014 | Golani | .................... | H04L 43/08 709/224 |

\* cited by examiner

SYSTEM FOR MONITORING FAILURE OF SUBSTRATE PROCESSING APPARATUS, AND METHOD FOR MONITORING FAILURE OF SUBSTRATE PROCESSING APPARATUS

CROSS REFERENCE TO RELATED APPLICATION

This application is a 35 U.S.C. 371 National Phase Entry Application from PCT/JP2013/001691, filed Mar. 14, 2013, which claims priority to Japanese Patent Application No. 2012-069430, filed Mar. 26, 2012, the disclosures of which are incorporated herein in their entirety by reference.

TECHNICAL FIELD

The present invention relates to a failure monitoring system and method for monitoring a failure of a substrate processing apparatus.

BACKGROUND

Conventionally, a plurality of substrate processing apparatuses has been used in manufacturing, for example, a substrate for a flat panel display or a semiconductor device, or a solar battery panel. For example, various kinds of substrate processing apparatuses such as, for example, a semiconductor wafer cleaning apparatus, a coating and developing apparatus, an etching apparatus, a film forming apparatus, and a heat treatment apparatus have been used in manufacturing a semiconductor device (see, e.g., Patent Document 1). Some of the substrate processing apparatuses are configured to issue an alarm when any failure occurs.

However, the substrate processing apparatuses tend to be complicated in configuration, and a failure tends to not only occur in a single area but also occur in correlated areas in a composite or chained manner. For example, in some cases, alarms may be issued in thousands of areas in a heat treatment furnace that conducts a batch processing of semiconductor wafers. In addition, when a failure occurs in such a substrate processing apparatus, it is difficult to accurately specify a failure occurring area and perform maintenance of the failure occurring area and an apparatus maintenance engineer is required to have a high skill.

PRIOR ART DOCUMENT

Patent Document

Patent Document 1: Japanese Patent Laid-Open Publication No. 2012-19156

DISCLOSURE OF THE INVENTION

Problems to be Solved

As described above, substrate processing apparatuses have problems in that the substrate processing apparatuses become complicated in configuration and it becomes difficult to precisely specify a failure occurring area and perform maintenance of the failure occurring area.

The present invention has been made in an effort to solve the above-described problems and an object of the present invention is to provide a failure monitoring system and a failure monitoring method of a substrate processing apparatus which enables precise specifying and maintenance of a failing area in the substrate processing apparatus.

Means for Solving the Problems

An aspect of a failure monitoring system for monitoring a failure of a substrate processing apparatus of the present invention monitors a failure of a substrate processing apparatus that performs a predetermined processing on a substrate to be processed. The system includes an alarm collecting unit configured to collect alarms issued from the substrate processing apparatus, and an analyzing unit configured to analyze the alarms collected by the alarm collecting unit and display, as an image, an alarm issuing frequency in each monitoring period on a two-dimensional space, of which one axis represents an alarm ID that specifies an alarm issuing area and another axis represents a predetermined monitoring period.

An aspect of a failure monitoring method for monitoring a failure of a substrate processing apparatus monitors a failure of a substrate processing apparatus that performs a predetermined processing on a substrate to be processed. The method includes collecting alarms issued from the substrate processing apparatus, and analyzing the alarms collected by the collecting of the alarms and displaying as an image, an alarm issuing frequency in each monitoring period on a two-dimensional space, of which one axis represents an alarm ID that specify an alarm issuing area and another axis represents a predetermined monitoring period.

Effect of Invention

According to the present invention, a failure monitoring system and a failure monitoring method of a substrate processing apparatus enable precise specifying and maintenance of a failure occurring area in the substrate processing apparatus.

DETAIL DESCRIPTION FOR EXECUTING INVENTION

Hereinafter, exemplary embodiments of the present invention will be described with reference to the drawings.

Figure 1:
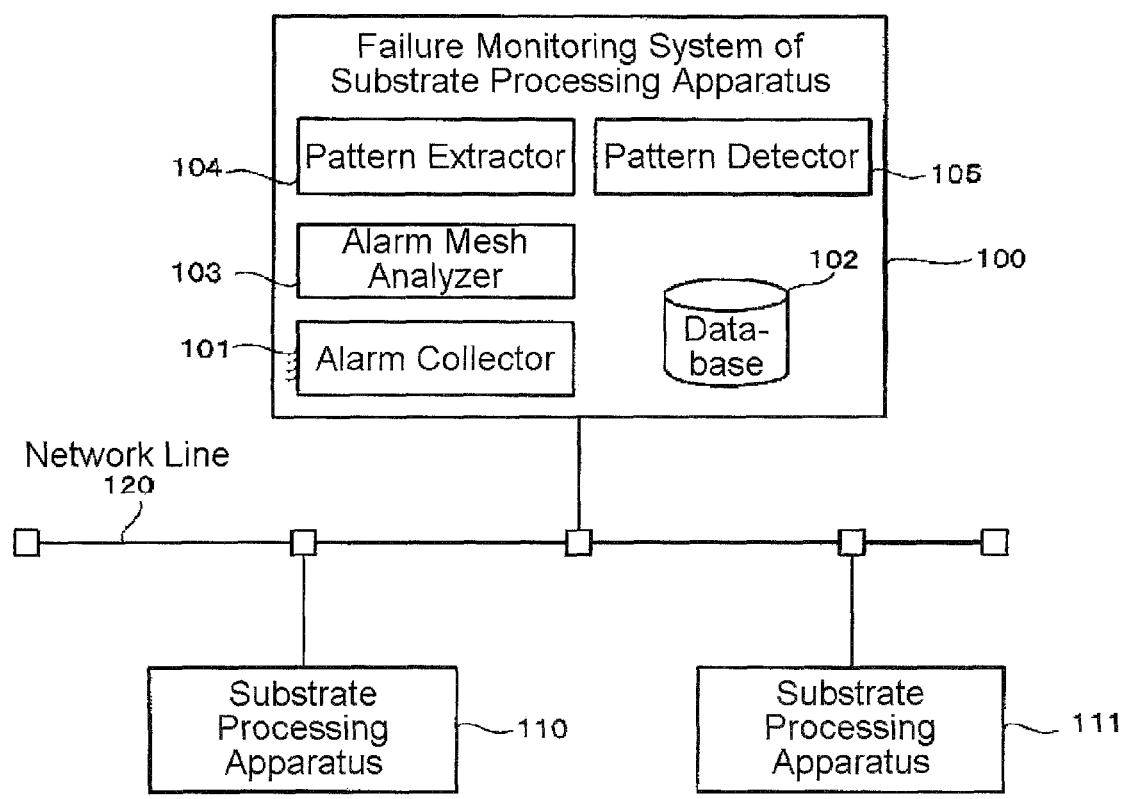
FIG. 1 is a view illustrating configuration of an exemplary embodiment of the present invention.

FIG. 1 is a schematic view illustrating a failure monitoring system of a substrate processing apparatus according to an exemplary embodiment of the present invention. Reference numeral "100" denotes a failure monitoring system of a substrate processing apparatus (hereinafter, simply referred to as a "failure monitoring system"), and reference numerals "110" and "111" denote substrate processing apparatuses in the present exemplary embodiment, heat treatment apparatuses (heat treatment furnaces) that perform a heat treatment on semiconductor wafers by a batch process. The failure monitoring system 100 is connected to substrate processing apparatuses 110 and 111 through a network line 120.

Each of the substrate processing apparatuses (heat treatment apparatuses) 110 and 111 is provided with components of a known heat treatment apparatus such as, for example, a cylindrical heat treatment furnace that is substantially vertically installed and has a bottom end opened as a furnace hole, a moving and placing mechanism that moves and places a semiconductor wafer between a wafer carrier and a quartz wafer boat, and a boat elevator that moves up and down the wafer boat to load and unload the wafer boat in relation to an inside of the heat treatment furnace.

Each of the substrate processing apparatuses is configured to move wafers within a wafer carrier to the wafer boat and place the wafers in the wafer boat by the moving and placing mechanism to introduce the wafer boat into the heat treatment furnace by the boat elevator, and to provide a predetermined atmosphere in the inside of the heat treatment furnace so as to perform a heat treatment of the semiconductor wafers.

In addition, alarm units are arranged in the components of each of the substrate processing apparatuses 110 and 111, respectively, in which the alarm units are configured such that, when various failures occur, for example, when a failure occurs while the semiconductor wafers are conveyed or when a failure occurs during the heat treatment, the alarm units issue alarms. Accordingly, a plurality of, for example, thousands of alarm units are arranged in each of the substrate processing apparatuses 110 and 111.

Besides the heat treatment apparatuses, for example, a coating and developing apparatus configured to perform coating and developing of a photoresist on a semiconductor wafer (substrate to be processed), an etching apparatus configured to perform etching on a semiconductor wafer (substrate to be processed), a film-forming apparatus configured to form a film on a semiconductor wafer (substrate to be processed), and a cleaning apparatus configured to clean a semiconductor wafer may also be applied to, for example, a substrate processing apparatus that process a flat panel display substrate or a solar battery panel, as the substrate processing apparatuses 110 and 111.

The failure monitoring system 100 includes an alarm collector 101, a database 102, an alarm mesh analyzer 103, a pattern extractor 104, and a pattern detector 105.

The alarm collector 101 functions to collect all the alarms issued by the substrate processing apparatuses 110 and 111, through a network line 120, and record the alarms.

The database 102 stores data related to issuance of the alarms collected by the alarm collector 101, data of a pattern in an alarm mesh to be described later, and data related to maintenance related to the pattern data.

The alarm mesh analyzer 103 functions to prepare and output an alarm mesh to be described later, based on data of the alarms issued by the substrate processing apparatuses 110 and 111 and collected by the alarm collector 101.

The pattern extractor 104 functions to find out a pattern from an alarm mesh to be described later.

The pattern detector 105 functions to give an alarm ID and pattern information in the alarm mesh as a retrieval key so as to retrieve a candidate pattern from the pattern information in the alarm mesh stored in the database 102 and output the candidate pattern.

For example, an AGC (Advanced Group Controller) is known as a system that totally controls a plurality of substrate processing apparatuses such as, for example, the substrate processing apparatuses 110 and 111, in which the AGC performs, for example, a processing of collecting all process data from the substrate processing apparatuses 110 and 111, for example, through the network line 120, a processing of analyzing the process data, and a processing of reflecting an analysis result and a centralized monitoring and further analysis/statistical result to a recipe. A computer that constitutes the AGC may be configured to have the functions of the alarm collector 101, the database 102, the alarm mesh analyzer 103, the pattern extractor 104, and the pattern detector 105 of the failure monitoring system 100.

The alarms issued in the substrate processing apparatuses 110 and 111 are collected by the alarm collector 101 and stored in the database 102 of the failure monitoring system 100. Information related to the alarms stored in the database 102 is totalized by the alarm mesh analyzer 103 for every predetermined monitoring period, for example, every day or every week.

Figure 2:
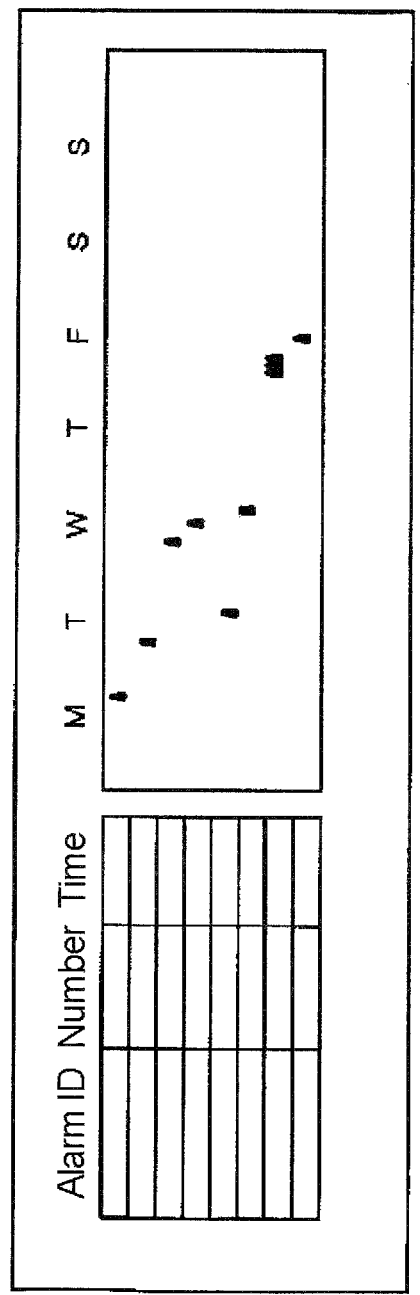
FIG. 2 is a view illustrating an exemplary alarm issuing situation chart.

The weekly totalized result is displayed, for example, on an alarm issuing situation chart screen as illustrated in FIG. 2. A total number of issued alarms and time (cumulated time) are indicated in the table illustrated in the left portion in FIG. 2 for each alarm ID that specifies an alarm issuing area. The right portion of FIG. 2 is configured to indicate alarm issuing time (time stamps) for each day from M (Monday) to S (Sunday) on a two-dimensional space, of which a vertical axis represents an alarm ID that specifies an alarm issuing area and a horizontal axis represents a predetermined monitoring period.

Figure 3:
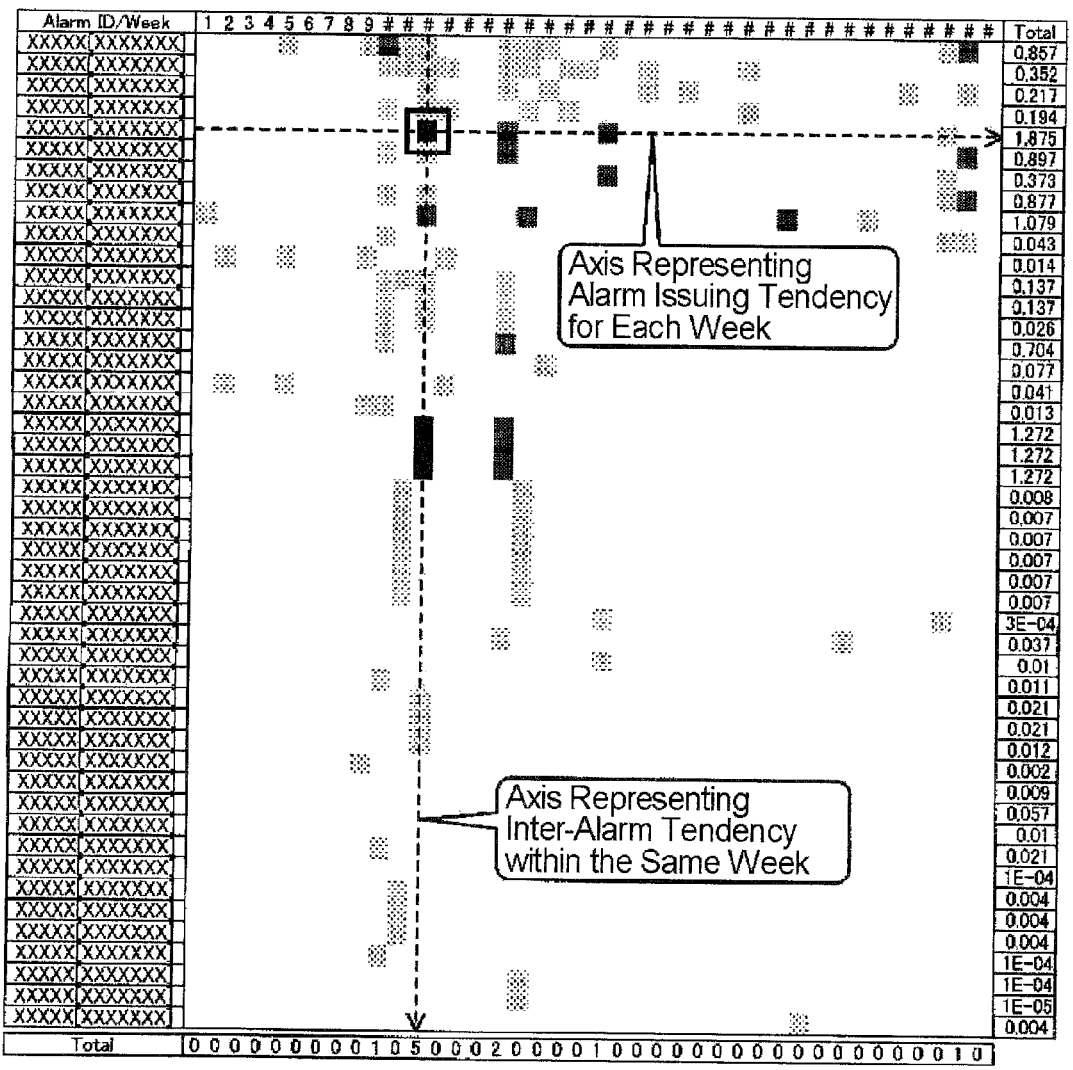
FIG. 3 is a view illustrating an exemplary alarm mesh display screen.

FIG. 3 illustrates an exemplary alarm mesh display which is prepared and output through the alarm mesh analyzer 103 based on the alarm issuing situation chart. In the alarm mesh, an issued alarm frequency is displayed as an image on the two-dimensional space of which the vertical axis represents an alarm ID that specifies an alarm issuing area and the horizontal axis represents a predetermined monitoring period (one week in the example illustrated in FIG. 3) in which an alarm frequency contour map is displayed as a two-dimensional image (alarm mesh).

In FIG. 3, a difference in alarm frequencies is indicated by a difference in fill patterns. However, in a real display image, the difference in alarm frequencies may be indicated by a difference in colors rather than by the difference in fill patterns. In such a case, the difference between frequencies may be indicate by a difference in colors in the following manner: for example, when the number of alarms is zero, it may be indicated by a base color (e.g. light blue), when alarms are issued with a low frequency, it may be indicated by yellow, when alarms are issued with an intermediate frequency, it may be indicated by an orange color, and when alarms are issued with a high frequency, it may be indicated by red. In addition, the difference in frequencies may be indicated by shades of colors.

Figure 4:
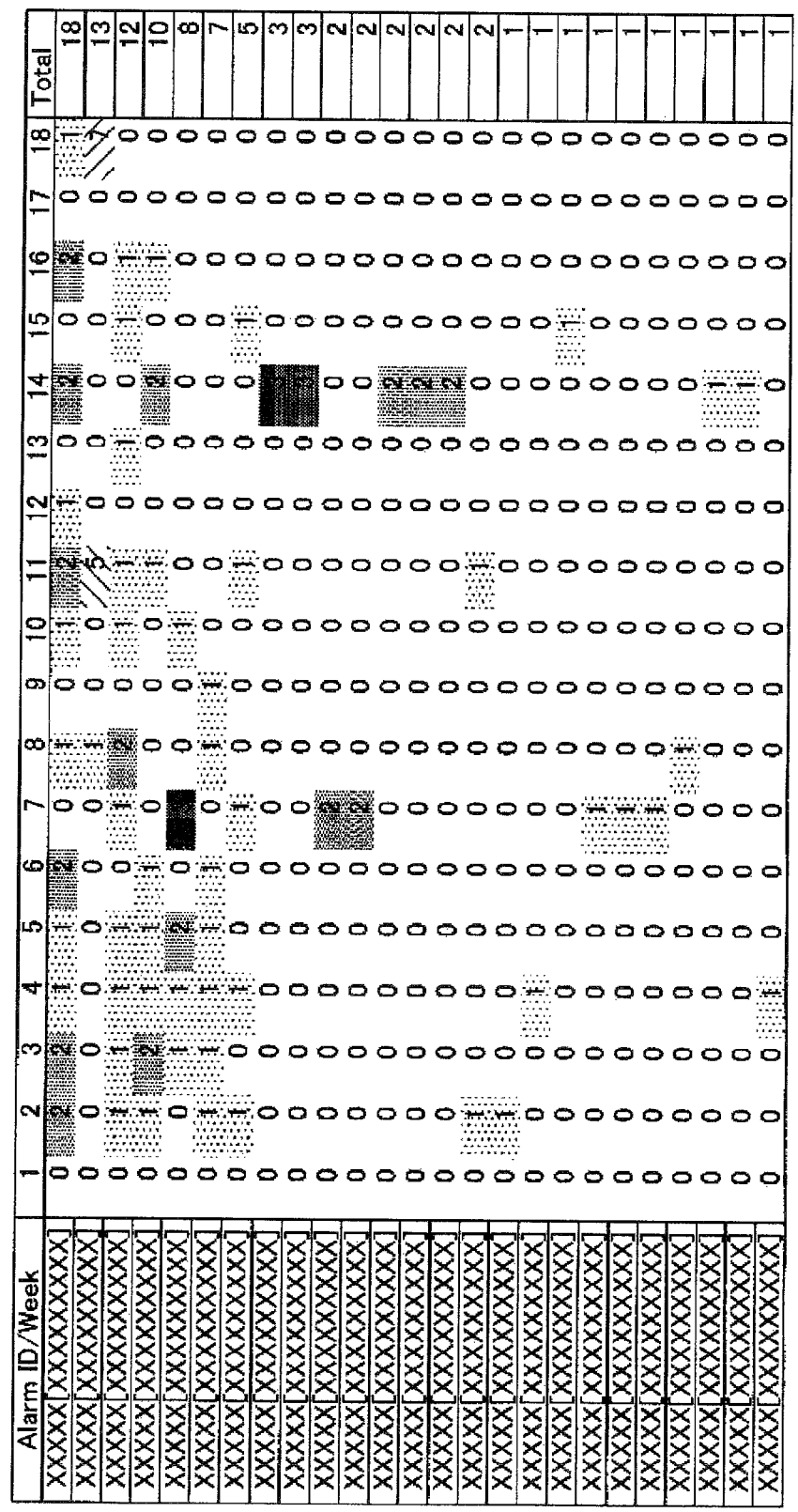
FIG. 4 is a view illustrating an exemplary alarm mesh display screen.

In addition, a display based on an alarm mesh may be configured such that numerical values are indicated together with the difference in colors as illustrated in FIG. 4. Further, in FIG. 4, the difference in colors is also indicated by the difference in fill patterns.

Figure 5:
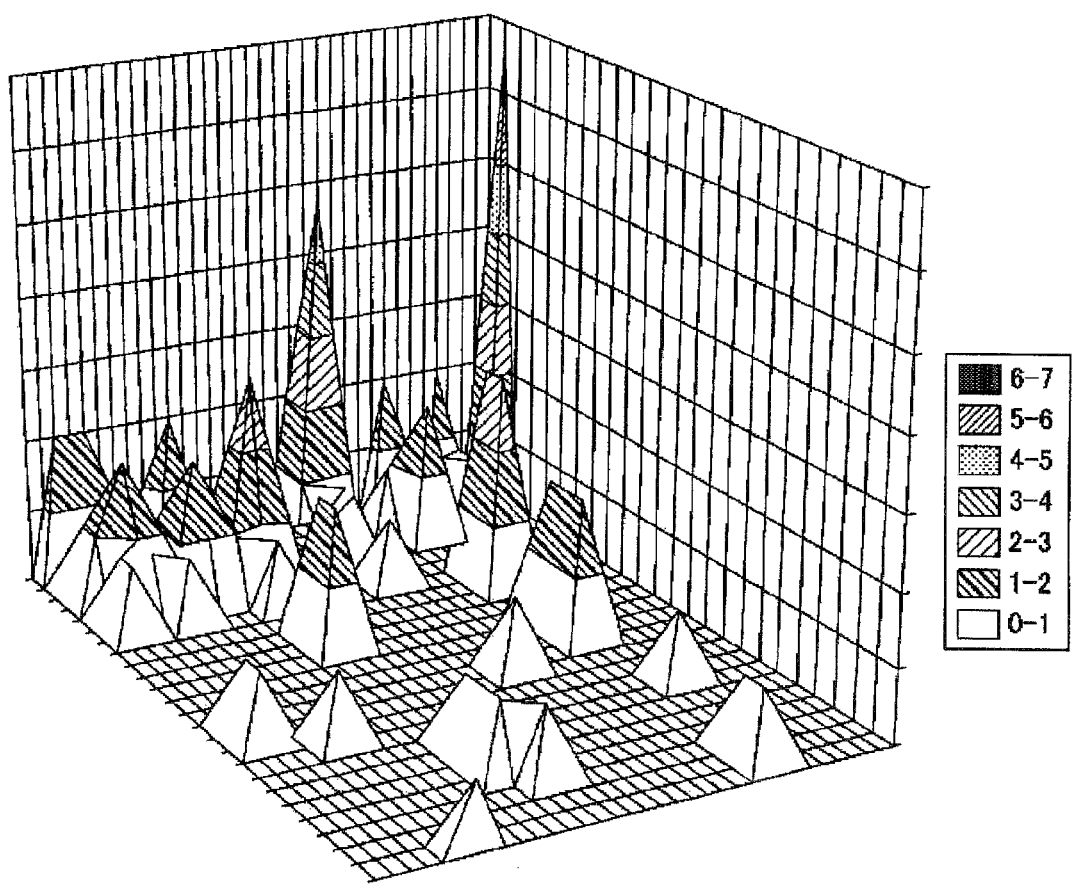
FIG. 5 is a view illustrating an exemplary alarm mesh display screen.

The exemplary alarm mesh illustrated in FIG. 3 is a two-dimensional image displayed as an alarm frequency contour map on a two-dimensional space (alarm mesh) of which the vertical axis represents an alarm ID that specifies an alarm issuing area and the horizontal axis represents a predetermined monitoring period. However, for example, as in an exemplary display screen illustrated in FIG. 5, the difference in alarm frequencies may be indicated three-dimensionally by a difference in three-dimensional heights, in addition to the difference in colors (in FIG. 5, indicated by a difference in fill pattern).

In the exemplary alarm mesh illustrated in FIG. 3, the horizontal axis represents an alarm issuing tendency for each week. Meanwhile, the vertical axis represents an inter-alarm tendency within the same week. When the alarming frequency contour map (alarm frequencies are indicated by colors) is displayed in the two-dimensional space (alarm mesh) of which the vertical axis represents an alarm ID that specifies an alarm issuing area and the horizontal axis represents a predetermined detecting period (the period is one week in the example illustrated in FIG. 3), as described above, it is possible to visually found as a pattern in the alarm mesh, for example, that a certain alarm is frequently issued from a certain period and that when the certain alarm is issued, other alarms are also issued in a chain manner.

This makes it possible to obtain a transition of past alarm issuance conditions over several weeks, and information related to alarms issued in connection with the issuance of a certain issuance and to more precisely specify failure occurring areas.

Also, when maintenance has been actually performed according to the issued alarm, information regarding the maintenance, for example, an area and content of the maintenance and a name of an apparatus maintenance engineer are registered in the database 102. In this case, the maintenance content is registered to be associated with the patterns in the alarm mesh which have been extracted by the pattern extractor 104.

Accordingly, when the information related to the maintenance actually performed according to the alarm issuance is registered in the database 102, information as to, for example, which maintenance should be performed for each pattern in the alarm mesh may be accumulated.

For example, as a result of maintenance related to an issued alarm, when the same alarm was not issued just after the maintenance but is issued again thereafter, the maintenance is not performed on a breakdown portion which fundamentally caused the alarm issuance. On the other hand, as the result of maintenance related to the issued alarm, when the same alarm has not been issued just after the maintenance and further thereafter, the maintenance is correctly performed on the breakdown portion which fundamentally caused the alarm issuance.

When such information is accumulated in the database 102, a database in which the patterns in the alarm mesh and correct maintenance methods are associated with each other may be constructed. By this, an apparatus maintenance engineer may correctly perform maintenance on the substrate processing apparatuses 110 and 120 with a complicated structure even if the engineer does not have a high skill.

That is, when performing the maintenance, the pattern extractor 104 extracts a pattern displayed in an alarm mesh of this time, and the pattern detector 105 detects whether the same pattern is stored in the database 102. When the same pattern is detected, the method used for coping with a case where the same pattern occurred in the past, for example, the maintenance area and the maintenance contents are read from the database 102 and the contents are displayed. By this, an area that requires maintenance for a failure and the maintenance contents may be presented.

Furthermore, in a case where a serious failure occurred after a certain alarm mesh pattern appeared, when this has been registered in the database 102, it is possible to predict the serious failure which may occur with high probability after the same alarm mesh pattern appears again. Therefore, the serious failure may be prevented by performing a countermeasure such as, for example, required maintenance in advance prior to the occurrence of the serious failure.

Figure 6:
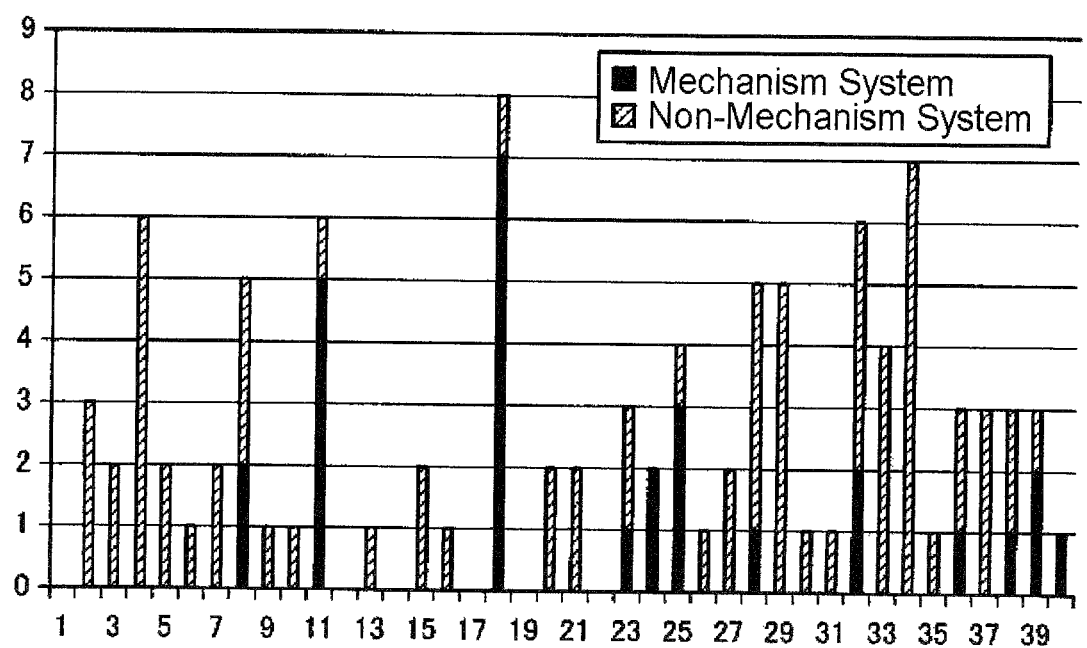
FIG. 6 is a view illustrating a display screen.
Figure 7:
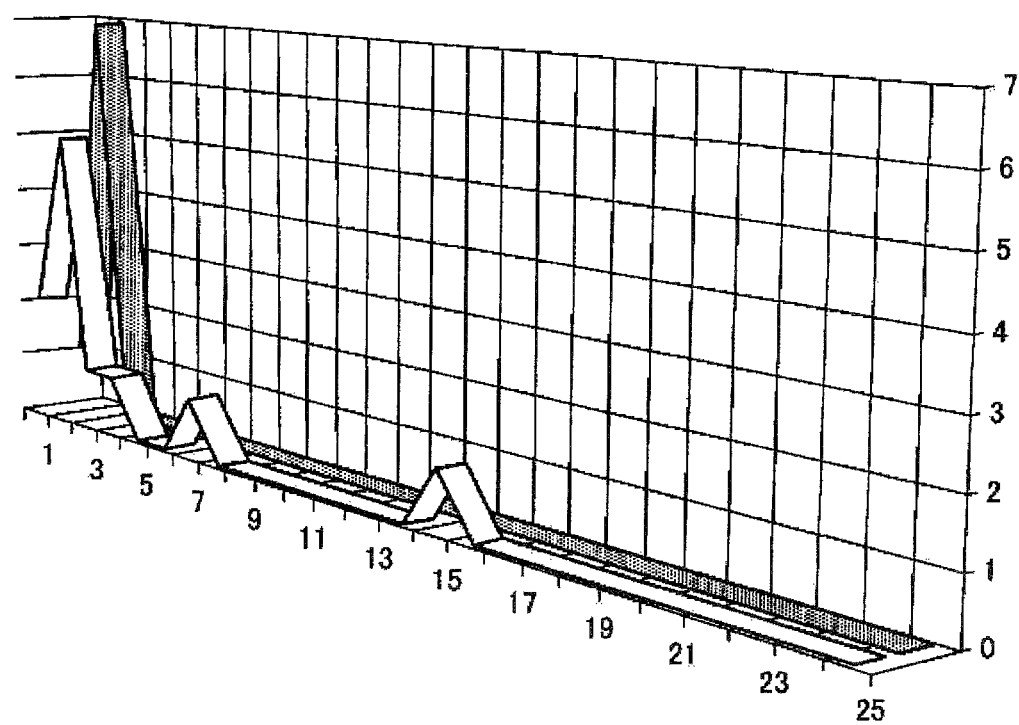
FIG. 7 is a view illustrating a display screen.

The alarm issuance may be generally classified as a mechanism system alarm or a non-mechanism system alarm. Due to this, as illustrated in FIG. 6, mechanism system alarm issuing situations and non-mechanism system alarm issuing situations may be indicated by, for example, colors on a bar graph (in FIG. 6, indicated by fill types). Further, for example, as illustrated in FIG. 7, the mechanical system alarm issuing situations and the non-mechanism system alarm issuing situations may be separately indicated three-dimensionally.

The present invention is not limited to the above-described exemplary embodiments, and may be variously modified.

For example, in the above-described exemplary embodiment, it has been described that the failure monitoring system 100 is arranged as a member installed separately from the substrate processing apparatuses 110 and 111. However, the failure monitoring system 100 may be embedded in each of the substrate processing apparatuses 110 and 111. In this case, a computer that controls the actions of the substrate processing apparatuses 110 and 111 may be configured to include the functions of the alarm collector 101, the database 102, the alarm mesh analyzer 103, the pattern extractor 104, and the pattern detector 105.

INDUSTRIAL APPLICABILITY

A failure monitoring system and method for a substrate processing apparatus may be used in, for example, a field of manufacturing a substrate for a semiconductor device or a flat panel display, or a solar battery panel. Therefore, the present invention has industrial applicability.

DESCRIPTION OF SYMBOL

100: Failure monitoring system of substrate processing apparatus
101: Alarm collector
102: Database
103: Alarm mesh analyzer
104: Pattern extractor
105: Pattern detector
110, 111: Substrate processing apparatus
129: Network line

What is claimed is:

1. A failure monitoring system for monitoring a failure of a substrate processing apparatus that performs a predetermined processing on a substrate to be processed, the failure monitoring system comprising:
an alarm collecting unit configured to collect alarms issued from the substrate processing apparatus; and
an analyzing unit configured to analyze the alarms collected by the alarm collecting unit and display, as an image, an alarm issuing frequency in each monitoring period on a two-dimensional space, of which one axis represents an alarm ID that specifies an alarm issuing area and another axis represents a predetermined monitor period thereby enabling a user to visually monitor both an alarm issuing tendency of the failure of the substrate processing apparatus for each of the predetermined monitor period and an inter-alarm tendency of the failure of the substrate processing apparatus within the predetermined monitor period.

2. The failure monitoring system of claim 1, further comprising:
a pattern extracting unit configured to extract patterns on the two dimensional space displayed by the analyzing unit; and a storage unit configured to store the patterns extracted by the pattern extracting unit and information related to a maintenance content such that the patterns and the information are related with each other.

3. The failure monitoring system of claim 2, wherein the storage unit stores the pattern extracted by the pattern extracting unit and information related to a failure occurring after the extracted pattern.

4. The failure monitoring system of claim 2, further comprising:
   a pattern detecting unit configured to detect a corresponding pattern stored in the storage unit from the patterns extracted by the pattern extracting unit.

5. The failure monitoring system of claim 1, wherein alarm issuing frequencies are indicated by a difference in colors.

6. The failure monitoring system of claim 1, wherein the substrate processing apparatus is any one of a substrate cleaning apparatus that cleans a substrate to be processed, a coating and developing system that coats and develops a photoresist on the substrate to be processed, an etching apparatus that performs etching on the substrate to be processed, a film-forming apparatus that forms a film on the substrate to be processed, and an heat treatment apparatus that performs a heat treatment on the substrate to be processed.

7. A failure monitoring method for monitoring a failure of a substrate processing apparatus that performs a predetermined processing on a substrate to be processed, the failure monitoring method comprising;
   collecting alarms issued from the substrate processing apparatus; and
   analyzing the collected alarms, and displaying, as an image, an alarm issuing frequency in each monitor period on a two-dimensional space, of which one axis represents an alarm ID that specifies an alarm issuing area and another axis represents a predetermined monitor period thereby enabling a user to visually monitor both an alarm issuing tendency of the failure of the substrate processing apparatus for each of the predetermined monitor period and an inter-alarm tendency of the failure of the substrate processing apparatus within the predetermined monitor period.

\* \* \* \* \*